United States Patent
Petro et al.

(10) Patent No.: US 12,269,969 B2
(45) Date of Patent: Apr. 8, 2025

(54) POLISHING COMPOSITION AND METHOD WITH HIGH SELECTIVITY FOR SILICON NITRIDE AND POLYSILICON OVER SILICON OXIDE

(71) Applicant: CMC Materials, Inc., Aurora, IL (US)

(72) Inventors: Benjamin Petro, St. Charles, IL (US); Juyeon Chang, Bolingbrook, IL (US); Brittany Johnson, Wood Dale, IL (US)

(73) Assignee: CMC MATERIALS LLC, Aurora, IL (US)

( * ) Notice: Subject to any disclaimer, the term of this patent is extended or adjusted under 35 U.S.C. 154(b) by 1040 days.

(21) Appl. No.: 17/076,989

(22) Filed: Oct. 22, 2020

(65) Prior Publication Data

US 2021/0115297 A1 Apr. 22, 2021

Related U.S. Application Data

(60) Provisional application No. 62/924,407, filed on Oct. 22, 2019.

(51) Int. Cl.
| | |
|---|---|
| *C09G 1/02* | (2006.01) |
| *B24B 37/04* | (2012.01) |
| *C09K 3/14* | (2006.01) |
| *H01L 21/321* | (2006.01) |

(52) U.S. Cl.
CPC .............. *C09G 1/02* (2013.01); *B24B 37/044* (2013.01); *C09K 3/1409* (2013.01); *C09K 3/1463* (2013.01); *H01L 21/3212* (2013.01)

(58) Field of Classification Search
CPC ...... C09G 1/02; B24B 37/044; C09K 3/1409; C09K 3/1463; H01L 21/3212
See application file for complete search history.

(56) References Cited

U.S. PATENT DOCUMENTS

| | | | |
|---|---|---|---|
| 5,196,353 A | 3/1993 | Sandhu | |
| 5,433,651 A | 7/1995 | Lustig | |
| 5,609,511 A | 3/1997 | Moriyama | |
| 5,643,046 A | 7/1997 | Katakabe | |
| 5,658,183 A | 8/1997 | Sandhu | |
| 5,730,642 A | 3/1998 | Sandhu | |
| 5,838,447 A | 11/1998 | Hiyama | |
| 5,872,633 A | 2/1999 | Holzapfel | |
| 5,893,796 A | 4/1999 | Birang | |
| 5,949,927 A | 9/1999 | Tang | |
| 5,964,643 A | 10/1999 | Birang | |
| 8,138,091 B2 | 3/2012 | Dysard et al. | |
| 8,808,573 B2 | 8/2014 | Ward | |
| 8,822,340 B2 | 9/2014 | Babu et al. | |
| 9,303,187 B2 | 4/2016 | Dinega et al. | |
| 9,597,768 B1 | 3/2017 | Pandey et al. | |
| 9,850,402 B2 | 12/2017 | Dinega et al. | |
| 2006/0108326 A1* | 5/2006 | Dysard | H01L 21/31053 438/692 |
| 2012/0070990 A1* | 3/2012 | Liu | C09G 1/02 977/773 |
| 2017/0066102 A1 | 3/2017 | Pandey | |
| 2017/0204293 A1 | 7/2017 | Megherh et al. | |
| 2018/0258319 A1 | 9/2018 | Akutsu et al. | |
| 2020/0354610 A1* | 11/2020 | Kamimura | H01L 21/3212 |
| 2021/0062041 A1* | 3/2021 | Arakawa | H01L 21/31053 |

FOREIGN PATENT DOCUMENTS

| | | | | |
|---|---|---|---|---|
| CN | 102046743 A | | 5/2011 | |
| CN | 107532067 A | | 1/2018 | |
| EP | 3296376 A1 * | | 3/2018 | ............. B24B 37/00 |
| JP | 2017057263 A | | 3/2017 | |
| JP | 2017139350 A | | 8/2017 | |
| KR | 20180068426 A | | 6/2018 | |
| TW | 201710421 A | | 3/2017 | |
| WO | 2007067294 A2 | | 6/2007 | |
| WO | 2013067696 A1 | | 5/2013 | |
| WO | 2017030710 A1 | | 2/2017 | |
| WO | 2017044340 A1 | | 3/2017 | |
| WO | 2017212874 A1 | | 12/2017 | |
| WO | 2018229005 A1 | | 12/2018 | |
| WO | WO-2019187977 A1 * | | 10/2019 | ............. B24B 37/00 |

OTHER PUBLICATIONS

Wikipedia "Tetraethylammonium" via https://en.wikipedia.org/wiki/Tetraethylammonium ; pp. 1-7 (Year: 2023).*
PubChem "Phosphonium, tetraethyl" via https://pubchem.ncbi.nlm.nih.gov/compound/Phosphonium_-tetraethyl ; pp. 1-22 (Year: 2023).*
Korean Intellectual Property Office as ISA, International Search Report and Written Opinion of the International Searching Authority issued in connection with PCT/US2020/056748 on Feb. 17, 2021.
Taiwan Intellectual Property Office, Search Report issued in connection with TW109136666 on Feb. 25, 2022.
Taiwan Intellectual Property Office, Search Report issued in connection with TW Application No. 109136666 on May 3, 2021.

* cited by examiner

*Primary Examiner* — Binh X Tran

(57) ABSTRACT

The invention provides a chemical-mechanical polishing composition comprising (a) an abrasive comprising ceria particles, (b) a cationic polymer selected from a cationic homopolymer, a cationic copolymer comprising at least one cationic monomer and at least one nonionic monomer, and a combination thereof, (c) a quaternary ammonium salt or a quaternary phosphonium salt, and (d) water, wherein the polishing composition has a pH of about 5 to about 8. The invention also provides a method of chemically-mechanically polishing a substrate, especially a substrate comprising silicon oxide, silicon nitride and/or polysilicon by contacting the substrate with the inventive chemical-mechanical polishing composition.

8 Claims, No Drawings

POLISHING COMPOSITION AND METHOD WITH HIGH SELECTIVITY FOR SILICON NITRIDE AND POLYSILICON OVER SILICON OXIDE

BACKGROUND OF THE INVENTION

Compositions and methods for planarizing or polishing the surface of a substrate are well known in the art. Polishing compositions (also known as polishing slurries) typically contain an abrasive material in a liquid carrier and are applied to a surface by contacting the surface with a polishing pad saturated with the polishing composition. Typical abrasive materials include silicon dioxide, cerium oxide, aluminum oxide, zirconium oxide, and tin oxide. Polishing compositions are typically used in conjunction with polishing pads (e.g., a polishing cloth or disk). Instead of, or in addition to, being suspended in the polishing composition, the abrasive material may be incorporated into the polishing pad.

In manufacturing of advanced memory and logic semiconductor devices, integrated circuit (IC) schemes require a selective removal of polysilicon and/or silicon nitride (SiN) layers. Upon removal of polysilicon and silicon nitride materials, a silicon oxide layer is exposed which is desirable to remain intact for further deposition and IC fabrication steps. An example of this process, with no intention of being limited to the examples presented here, is removal of silicon nitride material over silicon oxide for reverse shallow trench isolation (R-STI) processes. Additionally, selectivity for polysilicon and silicon nitride polishing in preference to silicon oxide (SiO) polishing is also required for 3D NAND device fabrication where an oxide or silicon nitride layer is formed on a silicon substrate containing a high aspect ratio. Vias are then formed by etching or photolithography, and a polysilicon layer is deposited to fill the vias. Due to variation in the depth of trenches or vias formed, it is typically necessary to deposit an excess of dielectric material (e.g., SiN or polysilicon) on top of the substrate to ensure complete filling of all trenches and vias. The excess dielectric material is then typically removed by a chemical-mechanical planarization (CMP) process to expose the silicon oxide layer as the stopping layer. When silicon oxide is exposed, a high degree of planarity and surface uniformity is desirable.

Generally, the practice has been to emphasize selectivity for polysilicon and/or SiN polishing in preference to oxide polishing using two CMP steps. Thus, the oxide layer has served as a stopping layer during the chemical-mechanical planarization process. Many current slurries provide moderate SiN rates and moderate selectivities, limiting their usefulness. For example, low to moderate polishing rates can limit throughput, while low to moderate polysilicon/oxide or SiN/oxide selectivities limit the usefulness of the current slurry technologies to larger structures with thicker polysilicon or silicon nitride coatings.

The dielectric material on the substrate is typically polished using a conventional abrasive-containing polishing composition. However, polishing silicon nitride or polysilicon with conventional abrasive-containing polishing compositions has been observed to result in overpolishing or underpolishing of the substrate surface. This phenomenon of overpolishing can yield recess formation in the pattern oxide features, referred to as dishing. Dishing is undesirable because dishing of substrate features may detrimentally affect device fabrication by causing failure of isolation of transistors and transistor components from one another, thereby resulting in short-circuits. Conversely, underpolishing of the substrate can result in incomplete or partial removal of polysilicon and/or SiN layers and further prevents the silicon oxide stopping layer from being exposed, resulting in poor planarity or poor electrical isolation which detrimentally affects device quality and performance.

Thus, there remains a need in the art for polishing compositions and methods that provide relatively high rates of removal of SiN and polysilicon, and for selective removal of SiN in preference to silicon oxide during CMP.

BRIEF SUMMARY OF THE INVENTION

The invention provides a chemical-mechanical polishing composition comprising (a) an abrasive comprising ceria particles, (b) a cationic polymer selected from a cationic homopolymer, a cationic copolymer comprising at least one cationic monomer and at least one nonionic monomer, and a combination thereof, (c) a quaternary ammonium salt or a quaternary phosphonium salt, and (d) water, wherein the polishing composition has a pH of about 5 to about 8.

The invention also provides a method of chemically mechanically polishing a substrate comprising (i) providing a substrate, (ii) providing a polishing pad, (iii) providing a chemical-mechanical polishing composition comprising (a) an abrasive comprising ceria particles, (b) a cationic polymer selected from a cationic homopolymer, a cationic copolymer comprising at least one cationic monomer and at least one nonionic monomer, and a combination thereof, (c) a quaternary ammonium salt or a quaternary phosphonium salt, and (d) water, wherein the polishing composition has a pH of about 5 to about 8, (iv) contacting the substrate with the polishing pad and the chemical-mechanical polishing composition, and (v) moving the polishing pad and the chemical mechanical polishing composition relative to the substrate to abrade at least a portion of a surface of the substrate to thereby polish the substrate.

DETAILED DESCRIPTION OF THE INVENTION

The invention provides a chemical-mechanical polishing composition comprising, consisting essentially of, or consisting of (a) an abrasive comprising ceria particles, (b) a cationic polymer selected from a cationic homopolymer, a cationic copolymer comprising at least one cationic monomer and at least one nonionic monomer, and a combination thereof, (c) a quaternary ammonium salt or a quaternary phosphonium salt, and (d) water, wherein the polishing composition has a pH of about 5 to about 8.

The chemical-mechanical polishing composition comprises an abrasive, wherein the abrasive comprises, consists essentially of, or consists of ceria particles.

As known to one of ordinary skill in the art, ceria is an oxide of the rare earth metal cerium, and is also known as ceric oxide, cerium oxide (e.g., cerium(IV) oxide), or cerium dioxide. Cerium(IV) oxide ($CeO_2$) can be formed by calcining cerium oxalate or cerium hydroxide. Cerium also forms cerium(III) oxides such as, for example, $Ce_2O_3$. The ceria abrasive can be any one or more of these or other oxides of ceria.

The ceria abrasive can be any suitable type of ceria. In an embodiment, the ceria is a wet-process ceria. As used herein, "wet-process" ceria refers to a ceria prepared by a precipitation, condensation-polymerization, or similar process (as opposed to, for example, fumed or pyrogenic ceria). Without wishing to be bound by any particular theory, it is believed that wet-process ceria comprises spherical ceria particles and/or smaller aggregate ceria particles. An illustrative wet-process ceria is HC-60™ ceria or HC90™ ceria, commercially available from Rhodia.

In another embodiment, the polishing composition contains abrasive particles including cubiform cerium oxide abrasive particles suspended in a liquid carrier. By "cubiform" it is meant that the ceria abrasive particles are in the form of a cube, i.e., substantially cubic. Stated another way, the cubiform ceria abrasive particles are cubic in form or nature. However, it will be understood that the edge dimensions, corners, and corner angles need not be exactly or precisely those of a perfect cube. For example, the cubiform abrasive particles may have slightly rounded or chipped corners, slightly rounded edges, edge dimensions that are not exactly equal to one another, corner angles that are not exactly 90 degrees, and/or other minor irregularities and still retain the basic form of a cube. One of ordinary skill in the art will readily able to recognize (e.g., via scanning electron microscopy or transmission electron microscopy) that the cubiform ceria abrasive particles are cubic in form with tolerances generally allowed for particle growth and deagglomeration.

As used herein, a chemical mechanical polishing composition including a cubiform ceria abrasive is one in which at least 25 number percent of the abrasive particles are cubic in nature (cubic in form as described above). In preferred embodiments, at least 40 number percent (e.g., at least 60 percent, or at least 80 percent) of the abrasive particles are cubic in nature. As noted above, the cubiform ceria abrasive particles may be readily evaluated and counted using TEM or SEM images, for example, at a magnification in a range from about 10,000× to about 500,000×. SEM or TEM images show abrasive particles having faces with four sides with similar length (e.g., within 20 percent of one another). The images also show that adjacent sides are approximately perpendicular, for example, forming an angle of about 90 degrees (e.g., within a range from about 80 to about 100 degrees). To determine whether or not a ceria abrasive composition includes cubiform ceria abrasive particles, SEM or TEM observation shall be made on a large number of randomly selected particles (i.e., more than 200) so that it is possible to perform a statistical analysis and thereby determine a percentage of the particles that have a square face. The particles retained must be such that their images are well visible on the micrographs. Some of the particles may exhibit some defects either on their surface and/or one or more of their corners and still be counted as being cubiform.

The cubiform ceria abrasive particles may be substantially pure ceria abrasive particles (within normal tolerances for impurities) or doped ceria abrasive particles. Doped ceria abrasive particles may include interstitial dopants (dopants that occupy a space in the lattice that is not normally occupied) or substitutional dopants (dopants that occupy a space in the lattice normally occupied by cerium or oxygen atoms). Such dopants may include substantially any metal atom, for example, including Ca, Mg, Zn, Zr, Sc, or Y.

Further description of suitable cubiform ceria may be found within the copending applications, filed on the same date as the present application, for example Ser. No. 62/924,328.

The wet process ceria particles can have any suitable average size (i.e., average particle diameter). The particle size of a particle is the diameter of the smallest sphere that encompasses the particle. If the average particle size of the ceria particles is too small, the polishing composition may not exhibit sufficient removal rate. In contrast, if the average particle size of the ceria particles is too large, the polishing composition may exhibit undesirable polishing performance such as, for example, poor substrate uniformity. Accordingly, the ceria particles can have an average particle size of about 60 nm or more, for example, about 65 nm or more, about 70 nm or more, about 75 nm or more, about 80 nm or more, about 85 nm or more, or about 90 nm or more. Alternatively, or in addition, the ceria particles can have an average particle size of about 120 nm or less, for example, about 115 nm or less, about 110 nm or less, about 105 nm or less, or about 100 nm or less. Thus, the ceria particles can have an average particle size bounded by any two of the aforementioned endpoints. For example, the ceria particles can have an average particle size of about 60 nm to about 120 nm, e.g., about 60 nm to about 115 nm, about 60 nm to about 110 nm, about 60 nm to about 105 nm, about 60 nm to about 100 nm, about 65 nm to about 120 nm, about 65 nm to about 115 nm, about 70 nm to about 120 nm, about 70 nm to about 115 nm, about 75 nm to about 120 nm, about 75 nm to about 115 nm, about 80 nm to about 120 nm, about 80 nm to about 115 nm, about 85 nm to about 120 nm, about 85 nm to about 115 nm, about 90 nm to about 120 nm, or about 90 nm to about 115 nm. For non-spherical wet process ceria particles, for example a small aggregate, the size of the particle is the diameter of the smallest sphere that encompasses the particle. The particle size of the ceria particles can be measured using any suitable technique, for example, using laser diffraction or dynamic light scattering techniques. Suitable particle size measurement instruments are available from, e.g., Malvern Instruments (Malvern, UK).

The ceria particles preferably are colloidally stable in the inventive polishing composition. The term colloid refers to the suspension of ceria particles in the water. Colloidal stability refers to the maintenance of that suspension through time. In the context of this invention, an abrasive is considered colloidally stable if, when the abrasive is placed into a 100 mL graduated cylinder and allowed to stand unagitated for a time of 2 hours, the difference between the concentration of particles in the bottom 50 mL of the graduated cylinder ([B] in terms of g/mL) and the concentration of particles in the top 50 mL of the graduated cylinder ([T] in terms of g/mL) divided by the initial concentration of particles in the abrasive composition ([C] in terms of g/mL) is less than or equal to 0.5 (i.e., $\{[B]-[T]\}/[C] \leq 0.5$). More preferably, the value of $[B]-[T]/[C]$ is less than or equal to 0.3, and most preferably is less than or equal to 0.1.

The polishing composition can comprise any suitable amount of ceria abrasive. If the polishing composition of the invention comprises too little ceria abrasive, the composition may not exhibit sufficient removal rate. In contrast, if the polishing composition comprises too much ceria abrasive, the composition may exhibit undesirable polishing performance, may not be cost effective, and/or may lack stability. The polishing composition can comprise about 1 wt. % or less of ceria, for example, about 0.9 wt. % or less, about 0.8 wt. % or less, about 0.7 wt. % or less, about 0.6 wt. % or less, or about 0.5 wt. % or less. Alternatively, or in addition, the polishing composition can comprise about 0.01 wt. % or more of ceria, for example, about 0.05 wt. % or more, about 0.1 wt. % or more, about 0.2 wt. % or more, about 0.3 wt. % or more, about 0.4 wt. % or more, or about 0.5 wt. % or more. Thus, the polishing composition can comprise ceria in an amount bounded by any two of the aforementioned endpoints. For example, the polishing composition can comprise about 0.01 wt. % to about 1 wt. % of ceria, e.g., about 0.1 wt. % to about 0.9 wt. %, about 0.1 wt.

% to about 0.8 wt. %, about 0.1 wt. % to about 0.7 wt. %, about 0.1 wt. % to about 0.6 wt. %, about 0.1 wt. % to about 0.5 wt. %, about 0.05 wt. % to about 1 wt. %, about 0.05 wt. % to about 0.9 wt. %, about 0.05 wt. % to about 0.8 wt. %, about 0.2 wt. % to about 0.7 wt. %, about 0.2 wt. % to about 0.6 wt. %, about 0.2 wt. % to about 0.5 wt. %, or about 0.3 wt. % to about 0.6 wt. %.

The polishing composition comprises a cationic polymer selected from a cationic homopolymer, a cationic copolymer comprising at least one cationic monomer and at least one nonionic monomer, and a combination thereof.

The cationic homopolymer can be any suitable cationic homopolymer consisting essentially of cationic monomer repeat units. For example, the cationic homopolymer can be any suitable cationic polymer consisting essentially of quaternary amine groups as repeat units. The quaternized amine groups can be acyclic or incorporated into a ring structure. Quaternized amine groups comprise tetrasubstituted nitrogen atoms substituted with four groups independently selected from alkyl, alkenyl, aryl, arylalkyl, acrylamido or methacrylate groups, or when incorporated into a ring structure, comprise either a heterocyclic saturated ring comprising a nitrogen atom and further substituted with two groups as described above or a N-heterocyclic group (e.g., imidazole or pyridine) having a further group as described above bonded to the nitrogen atom. Quaternized amine groups possess a positive charge (i.e., are cations having associated anionic moieties, thereby forming salts). The cationic polymers of the present invention may be further modified by chemical reactions such as alkylation, acylation, ethoxylation, and the like, in order to alter the solubility, viscosity, or other physical parameter of the cationic polymer. Suitable quaternary amine monomers include, for example, quaternized vinylimidazole (vinylimidazolium), methacryloyloxyethyltrimethylammonium (MADQUAT), diallyldimethylammonium (DADMAC), methacrylamidopropyltrimethylammonium (MAPTAC), epichlorohydrin-dimethylamine (epi-DMA) and combinations thereof.

In some embodiments the cationic polymer can be a copolymer comprising at least one cationic monomer and at least one nonionic monomer, wherein the at least one cationic monomer comprises either more than 50% of the copolymer on a molar basis or about 50% or less of the copolymer on a molar basis. The cationic monomers can be as described herein in connection with the cationic homopolymer. Non limiting examples of suitable nonionic monomers include vinylpyrrolidone, vinylcaprolactam, vinylimidazole, acrylamide, vinyl alcohol, polyvinyl formal, polyvinyl butyral, poly(vinyl phenyl ketone), vinylpyridine, polyacrolein, ethylene, propylene, styrene, and combinations thereof.

Suitable cationic polymers include, for example, quaternized poly(vinylimidazole) methyl sulfate, poly(methacryloyloxyethyltrimethylammonium) chloride (polyMADQUAT), poly(diallyldimethylammonium) chloride (polyDADMAC), poly(dimethylamine-co-epichlorohydrin), poly[bis(2-chloroethyl) ether-alt-1,3-bis[3-(dimethylamino)propyl]urea] (i.e. Polyquaternium-2), copolymers of acrylamide and diallyldimethylammonium (i.e. Polyquaternium-7), copolymers of vinylpyrrolidone and quaternized dimethylaminoethyl methacrylate (i.e. Polyquatemium-11), copolymers of vinylpyrrolidone and quaternized vinylimidazole (i.e. Polyquaternium-16), a terpolymer of vinylcaprolactam, vinylpyrrolidone, and quaternized vinylimidazole (i.e. Polyquaternium-46), and 3-Methyl-1-vinylimidazolium methyl sulfate-N-vinylpyrrolidone copolymer (i.e. Poly-quaternium-44), copolymers of vinylpyrrolidone and diallyldimethylammonium. Additionally, suitable cationic polymers include cationic polymers for personal care such as Luviquat® Supreme, Luviquat® Hold, Luviquat® UltraCare, Luviquat® FC 370, Luviquat® FC 550, Luviquat® FC 552, Luviquat® Excellence, and combinations thereof.

When the polishing composition comprises a cationic homopolymer, the polishing composition can comprise any suitable amount of the cationic homopolymer. For example, the polishing composition can comprise about 1 ppm or more of cationic homopolymer, for example, about 5 ppm or more, about 10 ppm or more, about 15 ppm or more, about 20 ppm or more, about 25 ppm or more, or about 30 ppm or more, about 50 ppm or more. Alternatively, or in addition, the polishing composition can comprise about 200 ppm or less of cationic homopolymer, for example, about 175 ppm or less, about 150 ppm or less, about 125 ppm or less, about 100 ppm or less, about 90 ppm or less, about 85 ppm or less, about 80 ppm or less, about 75 ppm or less, about 70 ppm or less, about 65 ppm or less, about 60 ppm or less, about 55 ppm or less, or about 50 ppm or less. Thus, the polishing composition can comprise a cationic homopolymer in an amount bounded by any two of the aforementioned endpoints. For example, the polishing composition can comprise about 1 ppm to about 200 ppm of cationic homopolymer, e.g., about 1 ppm to about 80 ppm, about 1 ppm to about 75 ppm, about 1 ppm to about 70 ppm, about 1 ppm to about 65 ppm, about 1 ppm to about 60 ppm, about 5 ppm to about 125 ppm, about 10 ppm to about 100 ppm, about 10 ppm to about 90 ppm, about 10 ppm to about 85 ppm, about 10 ppm to about 80 ppm, about 10 ppm to about 75 ppm, about 10 ppm to about 70 ppm, about 10 ppm to about 65 ppm, about 10 ppm to about 60 ppm, about 20 ppm to about 200 ppm, about 20 ppm to about 125 ppm, about 20 ppm to about 100 ppm, about 20 ppm to about 90 ppm, about 20 ppm to about 85 ppm, about 20 ppm to about 80 ppm, about 20 ppm to about 75 ppm, about 20 ppm to about 70 ppm, about 20 ppm to about 65 ppm, about 20 ppm to about 60 ppm, about 30 ppm to about 200 ppm, about 30 ppm to about 150 ppm, about 30 ppm to about 100 ppm, about 30 ppm to about 90 ppm, about 30 ppm to about 85 ppm, about 30 ppm to about 80 ppm, about 30 ppm to about 75 ppm, about 30 ppm to about 70 ppm, about 30 ppm to about 65 ppm, or about 30 ppm to about 60 ppm.

When the polishing composition comprises a cationic copolymer, the polishing composition can comprise any suitable amount of the cationic copolymer. For example, the polishing composition can comprise about 1 ppm or more of cationic copolymer, for example, about 10 ppm or more, about 20 ppm or more, about 50 ppm or more, about 100 ppm or more, about 120 ppm or more, about 130 ppm or more, about 140 ppm or more, about 150 ppm or more, about 160 ppm or more, about 170 ppm or more, about 180 ppm or more, about 190 ppm or more, or about 200 ppm or more. Alternatively, or in addition, the polishing composition can comprise about 1000 ppm or less of cationic copolymer, for example, about 950 ppm or less, about 900 ppm or less, about 850 ppm or less, about 800 ppm or less, about 750 ppm or less, about 700 ppm or less, about 650 ppm or less, about 600 ppm or less, about 505 ppm or less, or about 500 ppm or less. Thus, the polishing composition can comprise a cationic copolymer in an amount bounded by any two of the aforementioned endpoints. For example, the polishing composition can comprise about 1 ppm to about 1000 ppm of cationic copolymer, e.g., about 1 ppm to about 750 ppm, about 1 ppm to about 600 ppm, about 1 ppm to about 500 ppm, about 10 ppm to about 950 ppm, about 100 ppm to about 900 ppm, about 100 ppm to about 850 ppm, about 100 ppm to about 800 ppm, about 100 ppm to about 750 ppm, about 100 ppm to about 700 ppm, about 100 ppm to about 650 ppm, about 100 ppm to about 600 ppm, about 100 ppm to about 550 ppm, about 100 ppm to about 500 ppm, about 110 ppm to about 500 ppm, about 120 ppm to about 500 ppm, about 130 ppm to about 500 ppm, about 140 ppm to about 500 ppm, or about 150 ppm to about 500 ppm.

The polishing composition comprises a water-soluble quaternary ammonium salt or a quaternary phosphonium salt. In some embodiments, the quaternary ammonium salt has a structure selected from $R^1R^2R^3R^4N^{\oplus}X^{\ominus}$,

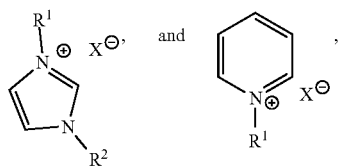

wherein $R^1$-$R^4$ are independently selected from $C_1$-$C_{12}$ alkyl, $C_1$-$C_{12}$ alkenyl, $C_6$-$C_{10}$ aryl, acrylamido, methacrylate, primary or secondary alcohol groups, and wherein $X^{\ominus}$ is an anion. When the R group is alkyl, alkenyl, or aryl type, containing $C_{16}$ or longer chains, undesirable silicon nitride removal rates and selectivity to silicon oxide may be observed. Preferred water soluble quaternary ammonium salts contain R groups less than $C_{16}$.

Without limitation, the anion, $X^{\ominus}$ can comprise common anion types such as fluoride, chloride, bromide, iodide, nitrate, nitrite, sulfite, sulfate, methylsulfate, phosphate. Preferred anions are chloride or bromide. Acetate anions, and anions similar to that of acetate, are less preferred because a loss of selectivity to oxide has been observed.

The quaternary phosphonium salt has the structure $R^1R^2R^3R^4P^{\oplus}X^{\ominus}$, wherein $R^1$-$R^4$ are independently selected from $C_1$-$C_{12}$ alkyl, $C_6$-$C_{10}$ aryl, and $C_1$-$C_{12}$ alkenyl, and wherein $X^{\ominus}$ is an anion. The phosphonium salt anion can be as described herein in connection with the quaternary ammonium salt anions.

In some embodiments, the polishing composition comprises a quaternary ammonium salt or a quaternary phosphonium salt comprising a cation $R^1R^2R^3R^4N^{\oplus}$ or $R^1R^2R^3R^4P^{\oplus}$ having a molecular weight of about 75 g/mol or more (e.g., about 80 g/mol or more, about 90 g/mol or more, about 100 g/mol or more, about 110 g/mol or more, about 120 g/mol or more, about 130 g/mol or more, or about 140 g/mol or more). Non-limiting examples of suitable quaternary ammonium salts include tetramethylammonium salts, tetraethylammonium salts, tetrapropylammonium salts, tetrabutylammonium salts, tetrapentylammonium salt, tetrahexylammonium salt, tetraheptylammonium salt, tetraoctylammonium salt, tetradodecylammonium salt, diallyldimethylammonium salt and derivatives, benzalkonium salt, N-alkylmethylimidazolium salts, N,N-diarylimidazolium salt, N-alkyl pyridinium salts, didecyldimethylamomonium salt, tetrabenzylammonium salt, benzyldimethyldecylammonium salt, benzyldimethylhexylammonium salt, benzyldimethyloctylammonium salt, benzyldodecyldimethylammonium salt, benzyltributylammonium salt, benzyltriethylammonium salt, benzyltrimethylammonium salt, decyltrimethylammonium salt, didodecyldimethylammonium salt, dodecylethyldimethylammonium salt, dodecyltrimethylammonium salt, hexyltrimethylammonium salt, methyltrioctylammonium salt, tributylmethylammonium salt, tridodecylmethylammonium salt, triethylhexylammonium salt, triethylmethylammonium salt, trimethyloctylammonium salt, trimethylphenylammonium salt, trihexyltetradecylammonium salt, [(3-methacryloylamino)propyl] trimethylammonium salt, (3-acrylamidopropyl) trimethylammonium salt, 2-(acryloyloxy) ethyltrimethylammonium salt, (vinylbenzyl) trimethylammonium salt, choline salt, tris(2-hydroxyethyl) methylammonium salt and the like. Non-limiting examples of suitable quaternary phosphonium salts include benzyltriphenylphosphonium salt, dimethyldiphenylphosphonium salt, tetrabutylphosphonium salt, tetramethylphosphonium salt, tetraphenylphosphonium salt, tetrapropylphosphonium salt, tetraoctylphosphonium salt, butyltriphenylphosphonium salt, tetraethylphosphonium salt, tributyldodecylphosphonium salt, ethyltriphenylphosphonium salt, hexyltriphenylphosphonium salt, heptyltriphenylphosphonium salt, isopropyltriphenylphosphonium salt, methyltriphenylphosphonium salt, tributylmethylphosphonium salt, tributyloctylphosphonium salt, triphenylpropylphosphonium salt, tributylhexylphosphonium salt and the like.

The polishing composition can comprise any suitable amount of the quaternary ammonium salt or quaternary phosphonium salt. For example, the polishing composition can comprise about 10 ppm or more of a quaternary ammonium salt or quaternary phosphonium salt, for example, about 25 ppm or more, about 50 ppm or more, about 100 ppm or more, about 110 ppm or more, about 120 ppm or more, about 130 ppm or more, about 140 ppm or more, about 150 ppm or more, about 160 ppm or more, about 170 ppm or more, about 180 ppm or more, about 190 ppm or more, or about 200 ppm or more. Alternatively, or in addition, the polishing composition can comprise about 1000 ppm or less of quaternary ammonium salt or quaternary phosphonium salt, for example, about 950 ppm or less, about 900 ppm or less, about 850 ppm or less, about 800 ppm or less, about 750 ppm or less, about 700 ppm or less, about 650 ppm or less, about 600 ppm or less, about 505 ppm or less, or about 500 ppm or less. Thus, the polishing composition can comprise a quaternary ammonium salt or quaternary phosphonium salt in an amount bounded by any two of the aforementioned endpoints. For example, the polishing composition can comprise about 10 ppm to about 1000 ppm of a quaternary ammonium salt, e.g., about 10 ppm to about 900 ppm, about 10 ppm to about 500 ppm, about 100 ppm to about 900 ppm, about 100 ppm to about 850 ppm, about 100 ppm to about 800 ppm, about 100 ppm to about 750 ppm, about 100 ppm to about 700 ppm, about 100 ppm to about 650 ppm, about 100 ppm to about 600 ppm, about 100 ppm to about 550 ppm, about 100 ppm to about 500 ppm, about 110 ppm to about 500 ppm, about 120 ppm to about 500 ppm, about 130 ppm to about 500 ppm, about 140 ppm to about 500 ppm, or about 150 ppm to about 500 ppm.

The chemical-mechanical polishing composition can comprise one or more compounds capable of adjusting (i.e., that adjust) the pH of the polishing composition (i.e., pH adjusting compounds). The pH of the polishing composition can be adjusted using any suitable compound capable of adjusting the pH of the polishing composition. The pH adjusting compound desirably is water-soluble and compatible with the other components of the polishing composition. Typically, the chemical-mechanical polishing composition has a pH of about 5 to about 8 at the point-of-use. Preferably, the chemical-mechanical polishing composition has a pH of about 5 to about 7 at the point-of-use, e.g, a pH of about 5 to about 6.

The pH-adjusting agent may be substantially any suitable pH-adjusting agent, such as an alkyl amine, an alcohol amine, quaternary amine hydroxide, ammonia, ammonium salts, alkali metal salts, carboxylic acids, alkali metal hydroxides, alkali metal carbonates, alkali metal bicarbonates, borates, phosphates, sulfates, acetates, malonates, oxalates, borates, ammonium salts, azoles, alkylammonium bases or conjugate acids, alkylammonium hydroxides, ammonium alkoxides or conjugate acids thereof, mixtures thereof, and the like. In certain embodiments, a suitable pH adjusting agent may include triethanolamine (TEA), tetramethylammonium hydroxide (TMAH or TMA-OH), or tetraethylammonium hydroxide (TEAH or TEA-OH). The polishing composition may include a sufficient concentration of the pH-adjusting agent to achieve and/or maintain the pH of the polishing composition within the pH ranges set forth above.

The chemical-mechanical polishing composition optionally further comprises one or more additives. Illustrative additives include conditioners, complexing agents, chelating agents, biocides, scale inhibitors, rheology modifiers, and dispersants.

A biocide or fungicide, when present, can be any suitable additive having or exhibiting biocidal or fungicidal properties as indicative of the following: limiting growth, no growth, elimination of, or any activity in-between, of any undesirable unicellular or multicellular organism and can be present in the polishing composition in any suitable amount. Without limitation, suitable biocides may include an isothiazolinone. Typically, the polishing composition contains about 1 ppm to about 100 ppm of biocide, preferably about 10 ppm to about 20 ppm. Suitable fungicides such as a diquaternary ammonium surfactant may be used.

The polishing composition can be produced by any suitable technique, many of which are known to those skilled in the art. The polishing composition can be prepared in a batch or continuous process. Generally, the polishing composition is prepared by combining the components of the polishing composition. The term "component" as used herein includes individual ingredients (e.g., ceria, cationic polymer, quaternary ammonium salt or quaternary phosphonium salt, optional pH adjustor, and/or any optional additive) as well as any combination of ingredients (e.g., ceria, cationic polymer, quaternary ammonium salt or quaternary phosphonium salt, optional pH adjustor).

For example, the polishing composition can be prepared by (i) providing all or a portion of the water, (ii) dispersing the ceria particles, cationic polymer, quaternary ammonium salt or quaternary phosphonium salt, optional pH adjustor, and/or any optional additive, using any suitable means for preparing such a dispersion, (iii) adjusting the pH of the dispersion as appropriate, and (iv) optionally adding suitable amounts of any other optional components and/or additives to the mixture.

Alternatively, the polishing composition can be prepared by (i) providing one or more components (e.g., water, cationic polymer, quaternary ammonium salt or quaternary phosphonium salt, optional pH adjustor, and/or any optional additive) in a ceria slurry, (ii) providing one or more components in an additive solution (e.g., water, cationic polymer, quaternary ammonium salt or quaternary phosphonium salt, optional pH adjustor, and/or any optional additive), (iii) combining the ceria slurry and the additive solution to form a mixture, (iv) optionally adding suitable amounts of any other optional additives to the mixture, and (v) adjusting the pH of the mixture as appropriate.

The polishing composition can be supplied as a one-package system comprising ceria particles, cationic polymer, quaternary ammonium salt or quaternary phosphonium salt, optional pH adjustor, and/or any optional additive, and water. Alternatively, the polishing composition of the invention can be supplied as a two-package system comprising a ceria slurry and an additive solution, wherein the ceria slurry consists essentially of, or consists of, ceria particles, optional pH adjustor, and water, and wherein the additive solution consists essentially of, or consists of, cationic polymer, quaternary ammonium salt or quaternary phosphonium salt, optional pH adjustor, and/or any optional additive. The two-package system allows for the adjustment of substrate global flattening characteristics and polishing speed by changing the blending ratio of the two packages, i.e., the ceria slurry and the additive solution.

Various methods can be employed to utilize such a two-package polishing system. For example, the ceria slurry and additive solution can be delivered to the polishing table by different pipes that are joined and connected at the outlet of supply piping. The ceria slurry and additive solution can be mixed shortly or immediately before polishing, or can be supplied simultaneously on the polishing table. Furthermore, when mixing the two packages, deionized water can be added, as desired, to adjust the polishing composition and resulting substrate polishing characteristics.

Similarly, a three-, four-, or more package system can be utilized in connection with the invention, wherein each of multiple containers contains different components of the inventive chemical-mechanical polishing composition, one or more optional components, and/or one or more of the same components in different concentrations.

In order to mix components contained in two or more storage devices to produce the polishing composition at or near the point-of-use, the storage devices typically are provided with one or more flow lines leading from each storage device to the point-of-use of the polishing composition (e.g., the platen, the polishing pad, or the substrate surface). As utilized herein, the term "point-of-use" refers to the point at which the polishing composition is applied to the substrate surface (e.g., the polishing pad or the substrate surface itself). By the term "flow line" is meant a path of flow from an individual storage container to the point-of-use of the component stored therein. The flow lines can each lead directly to the point-of-use, or two or more of the flow lines can be combined at any point into a single flow line that leads to the point-of-use. Furthermore, any of the flow lines (e.g., the individual flow lines or a combined flow line) can first lead to one or more other devices (e.g., pumping device, measuring device, mixing device, etc.) prior to reaching the point-of-use of the component(s).

The components of the polishing composition can be delivered to the point-of-use independently (e.g., the components are delivered to the substrate surface whereupon the components are mixed during the polishing process), or one or more of the components can be combined before delivery to the point-of-use, e.g., shortly or immediately before delivery to the point-of-use. Components are combined "immediately before delivery to the point-of-use" if the components are combined about 5 minutes or less prior to being added in mixed form onto the platen, for example, about 4 minutes or less, about 3 minutes or less, about 2 minutes or less, about 1 minute or less, about 45 seconds or less, about 30 seconds or less, about 10 seconds or less prior to being added in mixed form onto the platen, or simultaneously to the delivery of the components at the point-of-use (e.g., the components are combined at a dispenser). Components also are combined "immediately before delivery to the point-of-use" if the components are combined within 5 meters of the point-of-use, such as within 1 meters of the point-of-use or even within 10 cm of the point-of-use (e.g., within 1 cm of the point-of-use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing slurry are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing device preferably comprises a mixing mechanism to further facilitate the combination of the components. Mixing mechanisms are generally known in the art and include stirrers, blenders, agitators, paddled baffles, gas sparger systems, vibrators, etc.

The polishing composition also can be provided as a concentrate which is intended to be diluted with an appropriate amount of water prior to use. In such an embodiment, the polishing composition concentrate comprises the components of the polishing composition in amounts such that, upon dilution of the concentrate with an appropriate amount of water, each component of the polishing composition will be present in the polishing composition in an amount within the appropriate range recited above for each component. For example, the ceria particles, cationic polymer, quaternary ammonium salt or quaternary phosphonium salt, optional pH adjustor, and/or any optional additive can each be present in the concentrate in an amount that is about 2 times (e.g., about 3 times, about 4 times, or about 5 times) greater than the concentration recited above for each component so that, when the concentrate is diluted with an equal volume of water (e.g., 2 equal volumes water, 3 equal volumes of water, 4 equal volumes of water, or 5 equal volumes of water, respectively), each component will be present in the polishing composition in an amount within the ranges set forth above for each component. Furthermore, as will be understood by those of ordinary skill in the art, the concentrate can contain an appropriate fraction of the water present in the final polishing composition in order to ensure that the ceria, cationic polymer, quaternary ammonium salt or quaternary phosphonium salt, optional pH adjustor, and/or any optional additive are at least partially or fully dissolved in the concentrate.

The invention also provides a method of chemically-mechanically polishing a substrate with the polishing composition described herein. In particular, the invention provides a method of chemically mechanically polishing a substrate comprising (i) providing a substrate, (ii) providing a polishing pad, (iii) providing a chemical-mechanical polishing composition comprising (a) an abrasive comprising ceria particles, (b) a cationic polymer selected from a cationic homopolymer, a cationic copolymer comprising at least one cationic monomer and at least one nonionic monomer, and a combination thereof, (c) a quaternary ammonium salt or a quaternary phosphonium salt, and (d) water, wherein the polishing composition has a pH of about 5 to about 8, (iv) contacting the substrate with the polishing pad and the chemical-mechanical polishing composition, and (v) moving the polishing pad and the chemical mechanical polishing composition relative to the substrate to abrade at least a portion of a surface of the substrate to thereby polish the substrate.

The chemical-mechanical polishing composition can be used to polish any suitable substrate and is especially useful for polishing substrates comprising at least one layer (typically a surface layer) comprised of a low dielectric material. Suitable substrates include wafers used in the semiconductor industry. The wafers typically comprise or consist of, for example, a metal, metal oxide, metal nitride, metal composite, metal alloy, a low dielectric material, or combinations thereof. The method of the invention is particularly useful for polishing substrates comprising silicon oxide, silicon nitride, and/or polysilicon, e.g., any one, two, or especially all three of the aforementioned materials.

In certain embodiments, the substrate comprises polysilicon in combination with silicon oxide and/or silicon nitride. The polysilicon can be any suitable polysilicon, many of which are known in the art. It is well known in the art that the polysilicon substrate may also contain a doping agent. Any suitable dopant for polysilicon may be used. Without limitation, common dopants include boron and phosphorous. The polysilicon substrate can have any suitable phase, and can be amorphous, crystalline, or a combination thereof. Silicon nitride is also of any suitable type known in the art. Common types may include, without limitation, PE or LP. Any ratio between Si and N in the silicon nitride composition ratio may be suitable. Similarly, the silicon oxide can be any suitable silicon oxide, many of which are well known in the art. Suitable types of silicon oxide include but are not limited to TEOS, borophosphosilicate glass (BPSG), PETEOS, thermal oxide, undoped silicate glass, and HDP oxide.

As is well known in the art, due to the nature of application and inherent properties of polysilicon, it may be necessary to prepare the polysilicon thin film prior to performing the planarization step. As a hygroscopic and air-sensitive material, silicon naturally forms an oxide passivation layer upon exposure to water or atmospheric oxygen. Using embodiments presented herein and depending on composition and nature of polysilicon thin film, a preparatory step to removal this adventitious, native oxide layer from the polysilicon may be required. Methods to prepare the polysilicon are well known in the art, and include, without limitation; 1) an additional CMP step using high oxide rate slurry composition, or 2) use of an embodiment of the present invention at an increased tool downforce to remove native oxide layer to expose a fresh, less-oxidized polysilicon surface. Therefore, it is understood that the polishing rates described herein for polysilicon reflect rates of polishing after the native oxide layer has been removed.

The chemical-mechanical polishing composition of the invention desirably exhibits a low removal rate when polishing a substrate comprising silicon oxide according to a method of the invention. For example, when polishing silicon wafers comprising high density plasma (HDP) oxides and/or plasma-enhanced tetraethyl ortho silicate (PETEOS) and/or tetraethyl orthosilicate (TEOS) in accordance with an embodiment of the invention, the polishing composition desirably exhibits a removal rate of silicon oxide of about 500 Å/min or lower, e.g., about 400 Å/min or lower, about 300 Å/min or lower, about 200 Å/min or lower, about 100 Å/min or lower, about 50 Å/min or lower, about 40 Å/min or lower, about 30 Å/min or lower, about 20 Å/min or lower, or about 10 Å/min or lower.

The chemical-mechanical polishing composition of the invention desirably exhibits a high removal rate when polishing a substrate comprising silicon nitride according to a method of the invention. For example, when polishing silicon wafers comprising silicon nitride in accordance with an embodiment of the invention, the polishing composition desirably exhibits a removal rate of silicon nitride of about 500 Å/min or higher, e.g., about 600 Å/min or higher, about 700 Å/min or higher, about 800 Å/min or higher, about 900 Å/min or higher, about 1000 Å/min or higher, about 1100 Å/min or higher, about 1200 Å/min or higher, about 1300 Å/min or higher, about 1400 Å/min or higher, or about 1500 Å/min or higher.

The chemical-mechanical polishing composition of the invention desirably exhibits a high removal rate when polishing a substrate comprising polysilicon according to a method of the invention. For example, when polishing silicon wafers comprising polysilicon in accordance with an embodiment of the invention, the polishing composition desirably exhibits a removal rate of polysilicon of about 500 Å/min or higher, e.g., about 600 Å/min or higher, about 700 Å/min or higher, about 800 Å/min or higher, about 900 Å/min or higher, about 1000 Å/min or higher, about 1100 Å/min or higher, about 1200 Å/min or higher, about 1300 Å/min or higher, about 1400 Å/min or higher, or about 1500 Å/min or higher.

In some embodiments, the substrate comprises silicon nitride on a surface of the substrate, and at least a portion of the silicon nitride on a surface of the substrate is abraded at a removal rate to polish the substrate, and the substrate further comprises silicon oxide on a surface of the substrate. In these embodiments, at least a portion of the silicon oxide on a surface of the substrate is abraded at a removal rate to polish the substrate, wherein the removal rate of silicon oxide is less than the removal rate of silicon nitride.

In other embodiments, the substrate comprises polysilicon on a surface of the substrate, and at least a portion of the polysilicon on a surface of the substrate is abraded at a removal rate to polish the substrate, and the substrate further comprises silicon oxide on a surface of the substrate. In these embodiments, at least a portion of the silicon oxide on a surface of the substrate is abraded at a removal rate to polish the substrate, wherein the removal rate of silicon oxide is less than the removal rate of polysilicon.

Without wishing to be bound by any particular theory, it is believed that the cationic polymer is preferentially adsorbed onto the surface of silicon oxide. The cationic polymer is believed to form a protective film on a silicon oxide surface to inhibit contact between the polishing composition and the silicon oxide surface, thereby reducing the removal rate of silicon oxide while advantageously not significantly affecting the rate of silicon nitride removal. Addition of quaternary ammonium salt provides improved silicon oxide stopping capability by providing improved coverage of silicon oxide surface, thereby greatly reducing or inhibiting removal of the silicon oxide. In addition, it is believed that the quaternary ammonium salt or quaternary phosphonium salt functions to partition the cationic polymer into solution, so that there is more cationic polymer available for pad/wafer surfaces.

The chemical-mechanical polishing composition and method of the invention are particularly suited for use in conjunction with a chemical-mechanical polishing apparatus. Typically, the apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving the substrate relative to the surface of the polishing pad. The polishing of the substrate takes place by the substrate being placed in contact with the polishing pad and the polishing composition of the invention, and then the polishing pad moving relative to the substrate, so as to abrade at least a portion of the substrate to polish the substrate.

A substrate can be polished with the chemical-mechanical polishing composition using any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride, nylon, fluorocarbon, polycarbonate, polyester, polyacrylate, polyether, polyethylene, polyamide, polyurethane, polystyrene, polypropylene, coformed products thereof, and mixtures thereof. Soft polyurethane polishing pads are particularly useful in conjunction with the inventive polishing method. Typical pads include but are not limited to EPIC D100, NexPlanar Element series, NexPlanar Ultra series Ikonic 3000, Visionpad 5000, IC1010. Preferred polishing pads include NexPlanar E6088 and NexPlanar U5050 pads, commercially available from Cabot Microelectronics.

Desirably, the chemical-mechanical polishing apparatus further comprises an in situ polishing endpoint detection system, many of which are known in the art. Techniques for inspecting and monitoring the polishing process by analyzing light or other radiation reflected from a surface of the substrate being polished are known in the art. Such methods are described, for example, in U.S. Pat. Nos. 5,196,353, 5,433,651, 5,609,511, 5,643,046, 5,658,183, 5,730,642, 5,838,447, 5,872,633, 5,893,796, 5,949,927, and 5,964,643. Desirably, the inspection or monitoring of the progress of the polishing process with respect to a substrate being polished enables the determination of the polishing end-point, i.e., the determination of when to terminate the polishing process with respect to a particular substrate.

The invention can be characterized by the following embodiments.

EMBODIMENTS (1) In embodiment (1) is presented a chemical-mechanical polishing composition comprising:
 (a) an abrasive comprising ceria particles,
 (b) a cationic polymer selected from a cationic homopolymer, a cationic copolymer comprising at least one cationic monomer and at least one nonionic monomer, and a combination thereof,
 (c) a quaternary ammonium salt or a quaternary phosphonium salt, and
 (d) water,
wherein the polishing composition has a pH of about 5 to about 8.

(2) In embodiment (2) is presented the polishing composition of embodiment (1), wherein the polishing composition comprises about 0.01 wt. % to about 1 wt. % of ceria particles.

(3) In embodiment (3) is presented the polishing composition of embodiment (1) or (2), wherein the ceria particles have an average particle size of about 60 nm to about 120 nm.

(4) In embodiment (4) is presented the polishing composition of any one of embodiments (1)-(3), wherein the polishing composition comprises a cationic homopolymer, and wherein the polishing composition comprises about 1 ppm to about 200 ppm of the cationic homopolymer.

(5) In embodiment (5) is presented the polishing composition of embodiment (4), wherein the cationic homopolymer can be any suitable cationic homopolymer consisting essentially of cationic monomer repeat units. For example, the cationic homopolymer can be any suitable cationic polymer consisting essentially of quaternary amine groups as repeat units. The quaternized amine groups can be acyclic or incorporated into a ring structure. Quaternized amine groups comprise tetrasubstituted nitrogen atoms substituted with four groups independently selected from alkyl, alkenyl, aryl, arylalkyl, acrylamido or methacrylate groups, or when incorporated into a ring structure, comprise either a heterocyclic saturated ring comprising a nitrogen atom and further substituted with two groups as described above or a N-heterocyclic group (e.g., imidazole or pyridine) having a further group as described above bonded to the nitrogen atom. Quaternized amine groups possess a positive charge (i.e., are cations having associated anionic moieties, thereby forming salts). It also is suitable for the cationic polymer to be further modified by alkylation, acylation, ethoxylation, or other chemical reaction, in order to alter the solubility, viscosity, or other physical parameter of the cationic polymer. Suitable quaternary amine monomers include, for example, quaternized vinylimidazole (vinylimidazolium), methacryloyloxyethyltrimethylammonium (MADQUAT), diallyldimethylammonium (DADMAC), methacrylamidopropyltrimethylammonium (MAPTAC), epichlorohydrin-dimethylamine (epi-DMA) and combinations thereof. Suitable cationic polymers include, for example, quaternized poly(vinylimidazole) methyl sulfate, poly(methacryloyloxyethyltrimethylammonium) chloride (polyMADQUAT), poly(diallyldimethylammonium) chloride (polyDADMAC), poly(dimethylamine-co-epichlorohydrin), poly[bis(2-chloroethyl) ether-alt-1,3-bis[3-(dimethylamino)propyl]urea] (i.e. Polyquaternium-2) and combinations thereof.

(6) In embodiment (6) is presented the polishing composition of any one of embodiments (1)-(3), wherein the polishing composition comprises a cationic copolymer, and wherein the polishing composition comprises about 1 ppm to about 1000 ppm of the cationic copolymer.

(7) In embodiment (7) is presented the polishing composition of embodiment (6), wherein the cationic copolymer comprises at least one cationic monomer and at least one nonionic monomer, wherein the at least one cationic monomer comprises either more than 50% of the copolymer on a molar basis or about 50% or less of the copolymer on a molar basis. The cationic monomers can be as described herein in connection with the cationic homopolymer. Non limiting examples of suitable nonionic monomers include vinylpyrrolidone, vinylcaprolactam, vinylimidazole, acrylamide, vinyl alcohol, polyvinyl formal, polyvinyl butyral, poly(vinyl phenyl ketone), vinylpyridine, polyacrolein, ethylene, propylene, styrene, and combinations thereof. Suitable cationic copolymers include, for example, copolymers of acrylamide and diallyldimethylammonium (i.e. Polyquaternium-7), copolymers of vinylpyrrolidone and quaternized dimethylaminoethyl methacrylate (i.e. Polyquatemium-11), copolymers of vinylpyrrolidone and quaternized vinylimidazole (i.e. Polyquatemium-16), a terpolymer of vinylcaprolactam, vinylpyrrolidone, and quaternized vinylimidazole (i.e. Polyquaternium-46), and 3-Methyl-1-vinylimidazolium methyl sulfate-N-vinylpyrrolidone copolymer (i.e. Polyquatemium-44), copolymers of vinylpyrrolidone and diallyldimethylammonium. Additionally, suitable cationic polymers include cationic polymers for personal care such as Luviquat® Supreme, Luviquat® Hold, Luviquat® UltraCare, Luviquat® FC 370, Luviquat® FC 550, Luviquat® FC 552, Luviquat® Excellence, and combinations thereof.

(8) In embodiment (8) is presented the polishing composition of any one of embodiments (1)-(7), wherein the polishing composition comprises a quaternary ammonium salt, and wherein the quaternary ammonium salt is a halide comprising a quaternary ammonium cation having a molecular weight of about 75 g/mol or greater. Non limiting examples of suitable quaternary ammonium salts include tetramethylammonium salts, tetraethylammonium salts, tetrapropylammonium salts, tetrabutylammonium salts, tetrapentylammonium salt, tetrahexylammonium salt, tetraheptylammonium salt, tetraoctylammonium salt, tetradodecylammonium salt, diallyldimethylammonium salt and derivatives, benzalkonium salt, N-alkylmethylimidazolium salts, N,N-diarylimidazolium salt, N-alkyl pyridinium salts, didecyldimethylamomonium salt, tetrabenzylammonium salt, benzyldimethyldecylammonium salt, benzyldimethylhexylammonium salt, benzyldimethyloctylammonium salt, benzyldodecyldimethylammonium salt, benzyltributylammonium salt, benzyltriethylammonium salt, benzyltrimethylammonium salt, decyltrimethylammonium salt, didodecyldimethylammonium salt, dodecylethyldimethylammonium salt, dodecyltrimethylammonium salt, hexyltrimethylammonium salt, methyltrioctylammonium salt, tributylmethylammonium salt, tridodecylmethylammonium salt, triethylhexylammonium salt, triethylmethylammonium salt, trimethyloctylammonium salt, trimethylphenylammonium salt, trihexyltetradecylammonium salt, [(3-methacryloylamino)propyl]trimethylammonium salt, (3-acrylamidopropyl)trimethylammonium salt, 2-(acryloyloxy)ethyltrimethylammonium salt, (vinylbenzyl)trimethylammonium salt, choline salt, tris(2-hydroxyethyl)methylammonium salt and the like.

(9) In embodiment (9) is presented the polishing composition of any one of embodiments (1)-(7), wherein the polishing composition comprises a quaternary ammonium salt, and wherein the polishing composition comprises about 10 ppm to about 1000 ppm of the quaternary ammonium salt.

(10) In embodiment (10) is presented the polishing composition of any one of embodiments (1)-(7), wherein the polishing composition comprises a quaternary phosphonium salt, and wherein the quaternary phosphonium salt is a halide comprising a quaternary phosphonium cation having a molecular weight of about 94 g/mol or greater. Non limiting examples of suitable quaternary phosphonium salts include benzyltriphenylphosphonium salt, dimethyldiphenylphosphonium salt, tetrabutylphosphonium salt, tetramethylphosphonium salt, tetraphenylphosphonium salt, tetrapropylphosphonium salt, tetraoctylphosphonium salt, butyltriphenylphosphonium salt, tetraethylphosphonium salt, tributyldodecylphosphonium salt, ethyltriphenylphosphonium salt, hexyltriphenylphosphonium salt, heptyltriphenylphosphonium salt, isopropyltriphenylphosphonium salt, methyltriphenylphosphonium salt, tributylmethylphosphonium salt, tributyloctylphosphonium salt, triphenylpropylphosphonium salt, tributylhexylphosphonium salt and the like.

(11) In embodiment (11) is presented the polishing composition of any one of embodiments (1)-(7), wherein the polishing composition comprises a quaternary phosphonium salt, and wherein the polishing composition comprises about 10 ppm to about 1000 ppm of the quaternary phosphonium salt.

(12) In embodiment (12) is presented a method of chemically mechanically polishing a substrate comprising:
  (i) providing a substrate,
  (ii) providing a polishing pad,
  (iii) providing a chemical-mechanical polishing composition comprising:
    (a) an abrasive comprising ceria particles,
    (b) a cationic polymer selected from a cationic homopolymer, a cationic copolymer comprising at least one cationic monomer and at least one nonionic monomer, and a combination thereof,
    (c) a quaternary ammonium salt or a quaternary phosphonium salt, and
    (d) water,
    wherein the polishing composition has a pH of about 5 to about 8,
  (iv) contacting the substrate with the polishing pad and the chemical-mechanical polishing composition, and
  (v) moving the polishing pad and the chemical mechanical polishing composition relative to the substrate to abrade at least a portion of a surface of the substrate to thereby polish the substrate.

(13) In embodiment (13) is presented the method of embodiment (12), wherein the polishing composition comprises about 0.01 wt. % to about 1 wt. % of ceria particles.

(14) In embodiment (14) is presented the method of embodiment (12) or (13), wherein the ceria particles have an average particle size of about 60 nm to about 120 nm.

(15) In embodiment (15) is presented the method of any one of embodiments (12)-(14), wherein the polishing composition comprises a cationic homopolymer, and wherein the polishing composition comprises about 1 ppm to about 200 ppm of the cationic homopolymer.

(16) In embodiment (16) is presented the method of embodiment (15), wherein the wherein the cationic homopolymer can be any suitable cationic homopolymer consisting essentially of cationic monomer repeat units. For example, the cationic homopolymer can be any suitable cationic polymer consisting essentially of quaternary amine groups as repeat units. The quaternized amine groups can be acyclic or incorporated into a ring structure. Quaternized amine groups comprise tetrasubstituted nitrogen atoms substituted with four groups independently selected from alkyl, alkenyl, aryl, arylalkyl, acrylamido or methacrylate groups, or when incorporated into a ring structure, comprise either a heterocyclic saturated ring comprising a nitrogen atom and further substituted with two groups as described above or a N-heterocyclic group (e.g., imidazole or pyridine) having a further group as described above bonded to the nitrogen atom. Quaternized amine groups possess a positive charge (i.e., are cations having associated anionic moieties, thereby forming salts). It also is suitable for the cationic polymer to be further modified by alkylation, acylation, ethoxylation, or other chemical reaction, in order to alter the solubility, viscosity, or other physical parameter of the cationic polymer. Suitable quaternary amine monomers include, for example, quaternized vinylimidazole (vinylimidazolium), methacryloyloxyethyltrimethylammonium (MADQUAT), diallyldimethylammonium (DADMAC), methacrylamidopropyltrimethylammonium (MAPTAC), epichlorohydrin-dimethylamine (epi-DMA) and combinations thereof. Suitable cationic polymers include, for example, quaternized poly(vinylimidazole) methyl sulfate, poly(methacryloyloxyethyltrimethylammonium) chloride (polyMADQUAT), poly(diallyldimethylammonium) chloride (polyDADMAC), poly(dimethylamine-co-epichlorohydrin), poly[bis(2-chloroethyl) ether-alt-1,3-bis[3-(dimethylamino)propyl]urea] (i.e. Polyquaternium-2) and combinations thereof.

(17) In embodiment (17) is presented the method of any one of embodiments (12)-(14), wherein the polishing composition comprises a cationic copolymer, and wherein the polishing composition comprises about 1 ppm to about 1000 ppm of the cationic copolymer.

(18) In embodiment (18) is presented the method of embodiment (17), wherein the cationic copolymer comprises at least one cationic monomer and at least one nonionic monomer, wherein the at least one cationic monomer comprises either more than 50% of the copolymer on a molar basis or about 50% or less of the copolymer on a molar basis. The cationic monomers can be as described herein in connection with the cationic homopolymer. Non limiting examples of suitable nonionic monomers include vinylpyrrolidone, vinylcaprolactam, vinylimidazole, acrylamide, vinyl alcohol, polyvinyl formal, polyvinyl butyral, poly(vinyl phenyl ketone), vinylpyridine, polyacrolein, ethylene, propylene, styrene, and combinations thereof. Suitable cationic copolymers include, for example, copolymers of acrylamide and diallyldimethylammonium (i.e. Polyquaternium-7), copolymers of vinylpyrrolidone and quaternized dimethylaminoethyl methacrylate (i.e. Polyquaternium-11), copolymers of vinylpyrrolidone and quaternized vinylimidazole (i.e. Polyquaternium-16), a terpolymer of vinylcaprolactam, vinylpyrrolidone, and quaternized vinylimidazole (i.e. Polyquaternium-46), and 3-Methyl-1-vinylimidazolium methyl sulfate-N-vinylpyrrolidone copolymer (i.e. Polyquaternium-44), copolymers of vinylpyrrolidone and diallyldimethylammonium. Additionally, suitable cationic polymers include cationic polymers for personal care such as Luviquat® Supreme, Luviquat® Hold, Luviquat® UltraCare, Luviquat® FC 370, Luviquat® FC 550, Luviquat® FC 552, Luviquat® Excellence, and combinations thereof.

(19) In embodiment (19) is presented the method of any one of embodiments (12)-(18), wherein the polishing composition comprises a quaternary ammonium salt, and wherein the quaternary ammonium salt is a halide comprising a quaternary ammonium cation having a molecular weight of about 75 g/mol or greater. Non limiting examples of suitable quaternary ammonium salts include tetramethylammonium salts, tetraethylammonium salts, tetrapropylammonium salts, tetrabutylammonium salts, tetrapentylammonium salt, tetrahexylammonium salt, tetraheptylammonium salt, tetraoctylammonium salt, tetradodecylammonium salt, diallyldimethylammonium salt and derivatives, benzalkonium salt, N-alkylmethylimidazolium salts, N,N-diarylimidazolium salt, N-alkyl pyridinium salts, didecyldimethylamomonium salt, tetrabenzylammonium salt, benzyldimethyldecylammonium salt, benzyldimethylhexylammonium salt, benzyldimethyloctylammonium salt, benzyldodecyldimethylammonium salt, benzyltributylammonium salt, benzyltriethylammonium salt, benzyltrimethylammonium salt, decyltrimethylammonium salt, didodecyldimethylammonium salt, dodecylethyldimethylammonium salt, dodecyltrimethylammonium salt, hexyltrimethylammonium salt, methyltrioctylammonium salt, tributylmethylammonium salt, tridodecylmethylammonium salt, triethylhexylammonium salt, triethylmethylammonium salt, trimethyloctylammonium salt, trimethylphenylammonium salt, trihexyltetradecylammonium salt, [(3-methacryloylamino)propyl]trimethylammonium salt, (3-acrylamidopropyl)trimethylammonium salt, 2-(acryloyloxy)ethyltrimethylammonium salt, (vinylbenzyl)trimethylammonium salt, choline salt, tris(2-hydroxyethyl)methylammonium salt and the like.

(20) In embodiment (20) is presented the method of any one of embodiments (12)-(18), wherein the polishing composition comprises a quaternary ammonium salt, and wherein the polishing composition comprises about 10 ppm to about 1000 ppm of the quaternary ammonium salt.

(21) In embodiment (21) is presented the polishing composition of any one of embodiments (12)-(18), wherein the polishing composition comprises a quaternary phosphonium salt, and wherein the quaternary phosphonium salt is a halide comprising a quaternary phosphonium cation having a molecular weight of about 94 g/mol or greater. Non limiting examples of suitable quaternary phosphonium salts include benzyltriphenylphosphonium salt, dimethyldiphenylphosphonium salt, tetrabutylphosphonium salt, tetramethylphosphonium salt, tetraphenylphosphonium salt, tetrapropylphosphonium salt, tetraoctylphosphonium salt, butyltriphenylphosphonium salt, tetraethylphosphonium salt, tributyldodecylphosphonium salt, ethyltriphenylphosphonium salt, hexyltriphenylphosphonium salt, heptyltriphenylphosphonium salt, isopropyltriphenylphosphonium salt, methyltriphenylphosphonium salt, tributylmethylphosphonium salt, tributyloctylphosphonium salt, triphenylpropylphosphonium salt, tributylhexylphosphonium salt and the like.

(22) In embodiment (22) is presented the method of any one of embodiments (12)-(18), wherein the polishing composition comprises a quaternary phosphonium salt, and wherein the polishing composition comprises about 10 ppm to about 1000 ppm of the quaternary phosphonium salt.

(23) In embodiment (23) is presented the method of any one of embodiments (12)-(22), wherein the substrate comprises silicon nitride on a surface of the substrate, and wherein at least a portion of the silicon nitride on a surface of the substrate is abraded at a removal rate to polish the substrate.

(24) In embodiment (24) is presented the method of embodiment (23), wherein the substrate further comprises silicon oxide on a surface of the substrate, wherein at least a portion of the silicon oxide on a surface of the substrate is abraded at a removal rate to polish the substrate, and wherein the removal rate of silicon oxide is less than the removal rate of silicon nitride.

(25) In embodiment (25) is presented the method of any one of embodiments (12)-(22), wherein the substrate comprises polysilicon on a surface of the substrate, and wherein at least a portion of the polysilicon on a surface of the substrate is abraded at a removal rate to polish the substrate.

(26) In embodiment (26) is presented the method of embodiment (25), wherein the substrate further comprises silicon oxide on a surface of the substrate, wherein at least a portion of the silicon oxide on a surface of the substrate is abraded at a removal rate to polish the substrate, and wherein the removal rate of silicon oxide is less than the removal rate of polysilicon.

The following examples further illustrate the invention but, of course, should not be construed as in any way limiting its scope.

Example 1

This example demonstrates the effect of ceria particle size on removal rates of SiN and SiO, in accordance with an embodiment of the invention.

Substrates comprising SiN or SiO layers were separately polished with Polishing Composition 1A and Polishing Composition 1B. Polishing Composition 1A comprised 0.2 wt. % of ceria having an average particle size of 60 nm and 30 ppm of polyMADQUAT (poly(2-methacryloyloxyethyltrimethyl ammonium chloride) (i.e., a cationic homopolymer), at a pH of 5.3. Polishing Composition 1B comprised 0.2 wt. % of ceria having an average particle size of 90-110 nm and 30 ppm of polyMADQUAT, at a pH of 5.3. The polishing conditions were as follows: rotation (platen), 113 rpm; rotation (carrier), 107 rpm; slurry flow rate, 250 mL/min; downforce, 3 psi (20.7 kPa); polishing time, 60 sec.

After polishing, the SiN and SiO removal rates were determined, and the results set forth in Table 1. The SiN/SiO selectivity is the ratio of SiN removal rate to SiO removal rate.

TABLE 1

SiN and SiO Removal Rates as a Function of Ceria Particle Size

| Polishing Composition | Mean SiN RR (Å/min) | Mean SiO RR (Å/min) | SiN/SiO Selectivity |
|---|---|---|---|
| 1A | 407 | 22 | 18.5 |
| 1B | 1504 | 171 | 8.8 |

As is apparent from the results set forth in Table 1, Polishing Composition 1B, which contained ceria having an average particle size of 90-110 nm, exhibited SiN and SiO removal rates that were approximately 269% and 677% greater, respectively, than the SiN and SiO removal rates exhibited by Polishing Composition 1A, which contained ceria having an average particle size of 60 nm. Both Polishing Compositions 1A and 1B exhibited desirable SiN/SiO selectivities, with Polishing Composition 1B exhibiting an SiN/SiO selectivity that was approximately 47% of the SiN/SiO selectivity exhibited by Polishing Composition 1A.

Example 2

This example demonstrates the effect of the concentration of cationic homopolymers and cationic copolymers on SiN and SiO removal rates exhibited by polishing compositions comprising the same at a pH of 5.0, in accordance with an embodiment of the invention.

Substrates comprising SiN or SiO layers were separately polished with Polishing Compositions 2A-2E. Polishing Compositions 2A-2E contained 0.2 wt. % of ceria having an average particle size of 60 nm, 30 ppm of acetic acid buffer, and a biocide in water at a pH of 5.0. Polishing Composition 2A (control) did not contain any additional components. Polishing Compositions 2B and 2C further contained 30 ppm or 150 ppm of polyDADMAC homopolymer, respectively. Polishing Compositions 2D and 2E further contained 30 ppm or 150 ppm of polyDADMAC copolymer with acrylamide, respectively. The polishing conditions were as follows: rotation (platen), 100 rpm; rotation (carrier) 85 rpm; slurry flow rate, 150 mL/min; downforce, 2.5 psi (17.2 kPa); polishing time for SiN, 40 sec; polishing time for SiO, 120 sec.

Following polishing, the SiN and SiO removal rates were determined, and the results set forth in Table 2.

TABLE 2

SiN and SiO Removal Rates as a Function of Cationic Polymer

| Polishing Composition | Cationic Polymer | Amount of Cationic Polymer (ppm) | Mean SiN RR (Å/min) | Mean SiO RR (Å/min) | SiN/SiO Selectivity |
|---|---|---|---|---|---|
| 2A (control) | None | 0 | 223 | 1078 | 0.2 |
| 2B | polyDADMAC homopolymer | 30 | 125 | 7 | 17.9 |
| 2C | polyDADMAC homopolymer | 150 | 51 | 3 | 17 |
| 2D | DADMAC-acrylamide copolymer | 30 | 328 | 536 | 0.61 |
| 2E | DADMAC-acrylamide copolymer | 150 | 309 | 82 | 3.8 |

As is apparent from the results set forth in Table 2, increasing the concentration of polyDADMAC cationic homopolymer from 30 ppm in Polishing Composition 2B to 150 ppm in Polishing Composition 2C resulted in an approximately 59% decrease in the SiN removal rate and an approximately 50% decrease in the SiO removal rate. Increasing the concentration of polyDADMAC cationic copolymer from 30 ppm in Polishing Composition 2D to 150 ppm in Polishing Composition 2E resulted in an insignificant decrease in the SiN removal rate but an approximately 85% decrease in the SiO removal rate, resulting in an improvement in the SiN/SiO selectivity from 0.61 to 3.8. Thus, increasing the concentration of polyDADMAC cationic copolymer improved the SiN/SiO selectivity without significantly impacting the SiN removal rate, and also significantly decreased the SiO removal rate thereby maintaining a favorable SiN/SiO selectivity.

Example 3

This example demonstrates the effect of particular cationic polymers on SiN and SiO removal rates exhibited by polishing compositions comprising the same at a pH of 7.

Substrates comprising SiN or SiO layers were separately polished with Polishing Compositions 3A-3F. Polishing Compositions 3A-3F contained 0.4 wt. % of ceria having an average particle size of 90-110 nm and 40 ppm of triethanolamine buffer in water at a pH of 7. Polishing Composition 3A (control) did not contain any additional components. Polishing Composition 3B further contained 25 ppm of a DADMAC-vinylpyrrolidone copolymer comprising 30% DADMAC monomers. Polishing Composition 3C further contained 25 ppm of a DADMAC-vinylpyrrolidone copolymer comprising 50% DADMAC monomers. Polishing Composition 3C further contained 25 ppm of a DADMAC homopolymer. Polishing Composition 3E further contained 25 ppm of a quaternized vinylimidazole-vinylpyrrolidone copolymer comprising 30% quaternized vinylimidazole monomers. Polishing Composition 3F further contained 25 ppm of a quaternized poly(vinylimidazole) homopolymer. The polishing conditions were as follows: rotation (platen), 90 rpm; rotation (carrier), 93 rpm; slurry flow rate, 150 mL/min; downforce, 3 psi (20.7 kPa); polishing time for SiN and for SiO, 60 sec.

Following polishing, the SiN and SiO removal rates were determined, and the results set forth in Table 3.

TABLE 3

SiN and SiO Removal Rates as a Function of Cationic Polymer

| Polishing Composition | Cationic Polymer Type | % Cationic Monomers in Polymer | Mean SiN RR (Å/min) | Mean SiO RR (Å/min) | SiN/SiO Selectivity |
|---|---|---|---|---|---|
| 3A | None | — | 381 | 2492 | 0.15 |
| 3B | DADMAC-acrylamide copolymer | 30 | 856 | 3677 | 0.2 |
| 3C | DADMAC-acrylamide copolymer | 50 | 622 | 3037 | 0.2 |
| 3D | PolyDADMAC homopolymer | 100 | 692 | 19 | 36 |
| 3E | Quaternized Poly(vinylimiazole) copolymer | 30 | 907 | 3083 | 0.3 |
| 3F | Quaternized Poly(vinylimiazole) homopolymer | 100 | 1069 | 54 | 19.8 |

As is apparent from the results set forth in Table 3, as the percentage of cationic monomer units in the cationic polymer increased from 30% to 50% to 100% in Polishing Compositions 3B-3D, the SiN removal rate decreased from 856 Å/min to 692 Å/min, and the SiN/SiO selectivity increased from 0.2 to 36. Increasing the percentage of cationic monomer units in Polishing Compositions 3E and 3F, which contained cationic polymers comprising quaternized poly(vinylimidazole) monomer units, from 30% to 100% increased the SiN removal rates approximately 18% and increased the SiN/SiO selectivity approximately 66-fold.

Example 4

This example demonstrates the effect of a combination of a cationic polymer and a quaternary ammonium salt on SiN and SiO removal rates exhibited by polishing compositions comprising the same, in accordance with an embodiment of the invention.

Substrates comprising SiN or SiO layers were separately polished with Polishing Compositions 4A and 4B. Polishing Compositions 4A and 4B comprised 0.2 wt. % of ceria having an average particle size of 60 nm, quaternized poly(vinylimidazole) (i.e., a cationic homopolymer) and diallyldimethylammonium chloride monomer (DADMAC) (i.e., a quaternary ammonium salt) in amounts set forth in Table 4, 30 ppm of acetic acid buffer, and a biocide in water at a pH of 5.3. The polishing conditions were as follows: rotation (platen), 113 rpm; rotation (carrier), 107 rpm; slurry flow rate, 150 mL/min; downforce, 3 psi (20.7 kPa); polishing time for SiN and for SiO, 60 sec.

Following polishing, the SiN and SiO removal rates were determined, and the results set forth in Table 4.

TABLE 4

SiN and SiO Removal Rates as a Function of Cationic Polymer and Quaternary Ammonium Salt

| Polishing Composition | Cationic Polymer (ppm) | DADMAC (ppm) | Mean SiN RR (Å/min) | Mean SiO RR (Å/min) | SiN/SiO Selectivity |
|---|---|---|---|---|---|
| 4A | 10 | 50 | 184 | 194 | 0.9 |
| 4B | 50 | 550 | 740 | 28 | 26.4 |

As is apparent from the results set forth in Table 4, increasing the concentrations of quaternized poly(vinylimidazole) and DADMAC monomer from 10 ppm and 50 ppm to 50 ppm and 550 ppm, respectively, desirably resulted in an increase in the SiN removal rate of approximately 400% and a decrease in the SiO removal rate of approximately 86%. The resulting increase in SiN/SiO selectivity was approximately 29-fold.

Example 5

This example demonstrates the effect of a quaternary ammonium salt on the removal rates of SiN and SiO exhibited by a polishing composition comprising the same, in accordance with an embodiment of the invention.

Substrates comprising SiN or SiO layers were separately polished with Polishing Compositions 5A and 5B. Polishing Compositions 5A and 5B comprised 0.4 wt. % of ceria having an average particle size of 90-110 nm, 52 ppm of quaternized poly(vinylimidazole), 650 ppm of triethanolamine buffer, and a biocide in water at a pH of 7. Polishing Composition 5A did not contain a quaternary ammonium salt. Polishing Composition 5B further contained 500 ppm of DADMAC monomer (i.e., a quaternary ammonium salt). The polishing conditions were as follows: rotation (platen), 90 rpm; rotation (carrier), 93 rpm; slurry flow rate, 250 mL/min; polishing time for SiN and for SiO, 60 sec.

Following polishing, the SiN and SiO removal rates were determined, and the results set forth in Table 5.

TABLE 5

SiN and SiO Removal Rates as a Function of Quaternary Ammonium Salt

| Polishing Composition | DADMAC monomer (ppm) | Mean SiN RR (Å/min) | Mean SiO RR (Å/min) | SiN/SiO Selectivity |
|---|---|---|---|---|
| 5A | 0 | 1482 | 52 | 28.5 |
| 5B | 500 | 1639 | 26 | 63 |

As is apparent from the results set forth in Table 5, Polishing Composition 5B, which contained 500 ppm of DADMAC monomer, exhibited a SiN removal rate that was approximately 11% higher than the SiN removal rate exhibited by Polishing Composition 5A, which did not contain DADMAC monomer. The SiO removal rate exhibited by Polishing Composition 5B was approximately 50% of the SiO removal rate exhibited by Polishing Composition 5A. Thus, the presence of DADMAC monomer effectively suppressed SiO removal rate while not hindering the SiN removal rate exhibited by Polishing Composition 5B, resulting in a desirable increase in selectivity.

Example 6

This example demonstrates the effect of a combination of a cationic polymer and a quaternary ammonium salt on SiN and SiO removal rates exhibited by a polishing composition comprising the same.

Substrates comprising SiN or SiO layers were separately polished with Polishing Compositions 6A-6D. Polishing Compositions 6A-6D comprised 0.4 wt. % of ceria having an average particle size of 90-110 nm and 16.26 ppm of triethanolamine buffer in water at a pH of 7. Polishing Composition 6A (control) did not contain any additional components. Polishing Composition 6B (comparative) further contained 100 ppm of DADMAC monomer (i.e., a quaternary ammonium salt). Polishing Composition 6C (comparative) further contained 10 ppm of quaternized poly(vinylimidazole) (i.e., a cationic polymer). Polishing Composition 6D (inventive) further contained 10 ppm of quaternized poly(vinylimidazole) and 100 ppm of DADMAC monomer. The polishing conditions were as follows: rotation (platen), 93 rpm; rotation (carrier), 87 rpm; slurry flow rate, 50 mL/min; downforce, 2 psi (13.8 kPa); polishing time for SiN and for SiO, 60 sec.

Following polishing, the SiN and SiO removal rates were determined, and the results set forth in Table 6.

TABLE 6

SiN and SiO Removal Rates as a Function of Cationic Polymer and Quaternary Ammonium Salt

| Polishing Composition | Cationic polymer (ppm) | DADMAC monomer (ppm) | Mean SiN RR (Å/min) | Mean SiO RR (Å/min) | SiN/SiO Selectivity |
|---|---|---|---|---|---|
| 6A (control) | 0 | 0 | 590 | 5034 | 0.1 |
| 6B (comparative) | 0 | 100 | 497 | 4916 | 0.1 |
| 6C (comparative) | 10 | 0 | 1392 | 504 | 2.8 |
| 6D (inventive) | 10 | 100 | 1303 | 43 | 30.3 |

As is apparent from the results set forth in Table 6, Polishing Composition 6B, which contained 100 ppm of DADMAC monomer but did not contain quaternized poly(vinylimidazole), exhibited SiN/SiO selectivity that was substantially the same as control Polishing Composition 6A, which did not contain DADMAC monomer or quaternized poly(vinylimidazole). Polishing Composition 6C, which contained 10 ppm of quaternized poly(vinylimidazole) but did not contain DADMAC monomer, exhibited an SiN removal rate that was approximately 236% higher as compared to the SiN removal rate exhibited by control Polishing Composition 6A, and approximately 90% decrease in SiO removal rate compared to the SiO removal rate exhibited by control Polishing Composition 6A. Polishing Composition 6D, which contained 10 ppm of quaternized poly(vinylimidazole) and 100 ppm of DADMAC monomer exhibited a SiN removal rate that was approximately 121% higher than compared to the SiN removal rate exhibited by control Polishing Composition 6A, and a SiO removal rate that was approximately 99% lower than the SiO removal rate exhibited by control Polishing Composition 6A. Thus, the presence of a combination of 10 ppm of quaternized poly(vinylimidazole) and 100 ppm of DADMAC monomer in Polishing Composition 6D desirably suppressed the SiO removal rate with no significant impact to SiN removal rate compared to Polishing Composition 6C, and substantially improved selectivity, as compared with control Polishing Composition 6A and comparative Polishing Compositions 6B and 6C.

Example 7

This example demonstrates the effect of the number of carbon atoms in quaternary ammonium salts on SiN and SiO removal rates.

Substrates comprising SiN or SiO layers were separately polished with Polishing Compositions 7A-7K. Polishing Compositions 7A-7K each comprised 0.2 wt. % of ceria having an average particle size of 90-110 nm, 3.33 ppm of quaternized poly(vinylimidazole), 30 ppm of acetic acid buffer, and 1 mM of a quaternary ammonium salt as indicated in Table 7, in water at a pH of about 5.0. The polishing conditions were as follows: rotation (platen), 93 rpm; rotation (carrier), 87 rpm; slurry flow rate, 50 mL/min; downforce, 2 psi (13.8 kPa); polishing time for SiN and for SiO, 60 sec.

Following polishing, the SiN and SiO removal rates were determined, and the results set forth in Table 7.

TABLE 7

SiN and SiO Removal Rates as a Function of Carbon Number of Quaternary Ammonium Salt

| Polishing Composition | Quaternary Ammonium Salt | Number of Carbon Atoms in Quaternary Ammonium Salt | Mean SiN RR (Å/min) | Mean SiO RR (Å/min) | SiN/SiO Selectivity |
|---|---|---|---|---|---|
| 7A | None | 0 | 770 | 4192 | 0.2 |
| 7B | KCl | 0 | 774 | 4037 | 0.2 |
| 7C | $NH_4Cl$ | 0 | 785 | 4172 | 0.2 |
| 7D | $Me_4NBr$ | 4 | 812 | 1772 | 0.5 |
| 7E | Ethyl-3-methylimidazolium chloride | 6 | 832 | 2176 | 0.4 |
| 7F | $Et_4NBr$ | 8 | 784 | 2544 | 0.3 |
| 7G | Diallyl dimethylammonium chloride | 8 | 700 | 1755 | 0.4 |
| 7H | 1-Hexylpyridinium chloride | 11 | 744 | 1409 | 0.5 |
| 7I | $Bu_4NBr$ | 16 | 781 | 1812 | 0.4 |
| 7J | Trimethyl tetradecylammonium bromide | 17 | 545 | 642 | 0.8 |
| 7K | Benzalkonium chloride | 27 | 424 | 304 | 1.4 |

As is apparent from the results set forth in Table 7, Polishing Compositions 7A-7C, which did not contain a quaternary ammonium salt, exhibited high SiO removal rates and a low SiN/SiO selectivity. Polishing Compositions 7D-7I, which contained quaternary ammonium salts having 4-16 carbon atoms, exhibited SiO removal rates that were approximately 34-61% of the SiO removal rate exhibited by control Polishing Composition 7A, while maintaining SiN removal rates that were approximately 91-108% of the SiN removal rate exhibited by Polishing Composition 7A. Polishing Compositions 7J and 7K, which contained quaternary ammonium salts having 17 and 27 carbon atoms, respectively, exhibited SiO removal rates that were approximately 15% and 7% of the SiO removal rate exhibited by Polishing Composition 7A. The SiN removal rates exhibited by Polishing Compositions 7J and 7K were approximately 71% and 55%, respectively, of the SiN removal rate exhibited by Polishing Composition 7A, demonstrating a modest SiN removal rate suppression with quaternary ammonium salts having a number of carbons above about 16, which correlates with increased size and/or hydrophobicity of the alkyl substituents.

Example 8

This example demonstrates that effect of quaternary phosphonium salts and quaternary ammonium salts on polishing rates for substrates comprising SiN or SiO.

Substrates comprising SiN or SiO layers were separately polished with Polishing Compositions 8A-8F. Each of Polishing Compositions 8A-8F comprised 0.2 wt. % of ceria having an average particle size of 90-110 nm, 3.33 ppm of quaternized poly(vinylimidazole), and 30 ppm of acetic acid buffer in water at a pH of approximately 5.0. Polishing Compositions 8A-8F further contained tetrabutyl ammonium chloride ($Bu_4NCl$), tetrabutyl ammonium bromide ($Bu_4NBr$), or tetrabutyl phosphonium bromide ($Bu_4PBr$) in amounts set forth in Table 8. The polishing conditions were as follows: rotation (platen), 93 rpm; rotation (carrier), 87 rpm; slurry flow rate, 50 mL/min; downforce, 2 psi (13.8 kPa); polishing time for SiN and for SiO, 60 sec.

Following polishing, the SiN and SiO removal rates were determined, and the results set forth in Table 8.

TABLE 8

SiN and SiO Removal Rates as a Function of Type and Amount of Quaternary Salt

| Polishing Composition | Type of Quaternary Salt | Amount of Quaternary Salt (mM) | SiN RR (Å/min) | SiO RR (Å/min) | SiN/SiO Selectivity |
|---|---|---|---|---|---|
| 8A | $Bu_4NCl$ | 1 | 864 | 2452 | 0.35 |
| 8B | $Bu_4NCl$ | 5 | 863 | 545 | 1.58 |
| 8C | $Bu_4NBr$ | 1 | 892 | 1561 | 0.57 |
| 8D | $Bu_4NBr$ | 5 | 803 | 817 | 0.98 |
| 8E | $Bu_4PBr$ | 1 | 904 | 1606 | 0.56 |
| 8F | $Bu_4PBr$ | 5 | 769 | 724 | 1.06 |

As is apparent from the results set forth in Table 8, increasing the amounts of Bu4NCl, Bu4NBr, and Bu4PBr from 1 mM to 5 mM resulted in a relatively small (0-15%) change in the SiN removal rates while desirably decreasing the SiO removal rate to 22%, 52%, and 45% of the SiO removal rates exhibited by polishing compositions containing 1 mM of the quaternary ammonium or quaternary phosphonium salt. The SiN/SiO selectivity increased with the increase in the amounts of Bu4NCl, Bu4NBr, and Bu4PBr due to suppression of the SiO removal rates.

All references, including publications, patent applications, and patents, cited herein are hereby incorporated by reference to the same extent as if each reference were individually and specifically indicated to be incorporated by reference and were set forth in its entirety herein.

Example 9

This example demonstrates the effect of quaternary ammonium salt on the removal rates of SiN, SiO and polysilicon with cubiform ceria particles exhibited by a polishing composition comprising the same, in accordance with an embodiment of the invention.

Substrates comprising SiN, SiO and polysilicon layers were separately polished with Polishing Compositions 9A-9C. Each of Polishing Compositions 9A-9C comprised 0.2 wt. % of cubiform ceria having a BET specific surface area as determined by nitrogen adsorption to be 11.8 m² per gram, and an average particle size of 102 nm as measured by a Horiba 960 and 140 nm as measured by the Malvern Zetasizer. Additionally, each polishing composition comprised 30 ppm of quaternized poly(vinylimidazole) in water. Polishing Compositions 9A and 9B further contained 0.5 mM acetic acid buffer at a pH of about 5, and Polishing Composition 9C further contained 0.5 mM triethanolamine buffer at a pH of about 7. Polishing Composition 9A did not contain a quaternary ammonium salt. Polishing Compositions 9B and 9C further contained 300 ppm of diallyldimethylammonium chloride monomer (DADMAC) (i.e., a quaternary ammonium salt). The polishing conditions were as follows: rotation (platen), 113 rpm; rotation (carrier), 107 rpm; slurry flow rate, 150 mL/min; downforce, 3 psi (20.7 kPa); polishing time for SiN, SiO and polysilicon, 60 sec.

Following polishing, the SiN, SiO and polysilicon removal rates were determined, and the results set forth in Table 9.

TABLE 9

SiN, SiO and Polysilicon Removal Rates as a Function of Quaternary Ammonium Salt with Cubiform Ceria Particles

| Polishing Composition | DADMAC (ppm) | Slurry pH | SiN RR (Å/min) | SiO RR (Å/min) | Poly RR (Åmin) | SiN/SiO Selectivity | Poly/SiO Selectivity |
|---|---|---|---|---|---|---|---|
| 9A | 0 | 5 | 1417 | 169 | 16 | 8 | 0.1 |
| 9B | 300 | 5 | 1400 | 35 | 215 | 40 | 6 |
| 9C | 300 | 7 | 1307 | 26 | 1950 | 50 | 75 |

As is apparent by the results set forth in Table 9, Polishing Compositions 9B and 9C, containing 300 ppm DADMAC monomer, exhibited approximately 79% and 85% lower SiO removal rates, respectively, compared to Polishing Composition 9A, which did not contain any DADMAC monomer. The decrease in SiO removal rate for Polishing Compositions 9B and 9C further improved the SiN/SiO selectivities compared to Polishing Composition 9A by approximately 5-fold and 6-fold, respectively. Additionally, the selectivity of polysilicon polishing behavior changed from selectively removing SiO in Polishing Composition 9A, to preferring the removal of polysilicon over SiO in Polishing Compositions 9B and 9C, which contained DADMAC monomer.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
   (a) an abrasive comprising ceria particles, wherein the ceria particles have an average particle size of about 60 nm to about 120 nm,
   (b) about 1 ppm to about 200 ppm of a cationic homopolymer, wherein the cationic homopolymer consists essentially of quaternary amine groups as repeat units, wherein the quaternary amine groups are acyclic or incorporated into a ring structure,
   (c) a quaternary ammonium salt or a quaternary phosphonium salt, and
   (d) water,
   wherein the polishing composition has a pH of about 5 to about 8.

2. The polishing composition of claim 1, wherein the polishing composition comprises about 0.01 wt. % to about 1 wt. % of ceria particles.

3. The polishing composition of claim 1, wherein the polishing composition comprises a quaternary ammonium salt, and wherein the quaternary ammonium is a halide comprising a quaternary ammonium cation having a molecular weight of about 75 g/mol or greater.

4. The polishing composition of claim 1, wherein the polishing composition comprises a quaternary ammonium salt, and wherein the polishing composition comprises about 10 ppm to about 1000 ppm of the quaternary ammonium salt.

5. The polishing composition of claim 1, wherein the polishing composition comprises a quaternary phosphonium salt, and wherein the quaternary phosphonium salt is a halide comprising a quaternary phosphonium cation having a molecular weight of about 94 g/mol or greater.

6. The polishing composition of claim 1, wherein the polishing composition comprises a quaternary phosphonium salt selected from the group consisting of benzyltriphenylphosphonium salt, dimethyldiphenylphosphonium salt, tetrabutylphosphonium salt, tetramethylphosphonium salt, tetraphenylphosphonium salt, tetrapropylphosphonium salt, tetraoctylphosphonium salt, butyltriphenylphosphonium salt, tetraethylphosphonium salt, tributyldodecylphosphonium salt, ethyltriphenylphosphonium salt, hexyltriphenylphosphonium salt, heptyltriphenylphosphonium salt, isopropyltriphenylphosphonium salt, methyltriphenylphosphonium salt, tributylmethylphosphonium salt, tributyloctylphosphonium salt, triphenylpropylphosphonium salt, tributylhexylphosphonium salt and combinations thereof, and wherein the polishing composition comprises about 10 ppm to about 1000 ppm of the quaternary phosphonium salt.

7. The polishing composition of claim 1, wherein the polishing composition comprises a cationic copolymer, and wherein the polishing composition comprises about 1 ppm to about 1000 ppm of the cationic copolymer.

8. The polishing composition of claim 7, wherein the cationic copolymer comprises at least one cationic monomer and at least one nonionic monomer.

* * * * *